United States Patent
Elkhatib et al.

(10) Patent No.: US 12,367,873 B2
(45) Date of Patent: Jul. 22, 2025

(54) SYSTEM ARCHITECTURE AND EMBEDDED CIRCUIT TO LOCATE A LOST PORTABLE DEVICE USING VOICE COMMAND

(71) Applicant: AONDEVICES, INC., Irvine, CA (US)

(72) Inventors: Mouna Elkhatib, Irvine, CA (US); Adil Benyassine, Irvine, CA (US)

(73) Assignee: AONDEVICES, INC., Irvine, CA (US)

( * ) Notice: Subject to any disclaimer, the term of this patent is extended or adjusted under 35 U.S.C. 154(b) by 741 days.

(21) Appl. No.: 17/275,750

(22) PCT Filed: Sep. 13, 2019

(86) PCT No.: PCT/US2019/050981
§ 371 (c)(1),
(2) Date: Mar. 12, 2021

(87) PCT Pub. No.: WO2020/056236
PCT Pub. Date: Mar. 19, 2020

(65) Prior Publication Data
US 2022/0036881 A1  Feb. 3, 2022

Related U.S. Application Data

(60) Provisional application No. 62/772,476, filed on Nov. 28, 2018, provisional application No. 62/731,666, (Continued)

(51) Int. Cl.
*G10L 15/22* (2006.01)
*G06N 3/02* (2006.01)
(Continued)

(52) U.S. Cl.
CPC ............... *G10L 15/22* (2013.01); *G06N 3/02* (2013.01); *G06N 3/063* (2013.01); *G10L 15/08* (2013.01);
(Continued)

(58) Field of Classification Search
CPC ......... G10L 15/22; G10L 15/08; G10L 15/16; G10L 15/30; G10L 25/30; G10L 25/78; (Continued)

(56) References Cited

U.S. PATENT DOCUMENTS 7,292,678 B2  11/2007  Glynn et al.
8,862,476 B2  10/2014  Newman
(Continued)

OTHER PUBLICATIONS

PCT Search Report and Written Opinion for Application No. PCT/US19/50981 (Feb. 7, 2020).

*Primary Examiner* — Daniel C Washburn
*Assistant Examiner* — Paul J. Mueller
(74) *Attorney, Agent, or Firm* — Stetina Garred Brucker & Newboles

(57) ABSTRACT

Systems and methods are presented herein that include utilizing a specialized circuit architecture for the purpose of locating lost items through voice command recognition. The system can be customized with minimal, low power components to continuously monitor for a locating phrase and produce an audible alert when the locating phrase is detected. The system can be included in a stand-alone portable device that can be attached to electronic and non-electronic portable objects, or the system can be embedded with other circuitry into a portable electronic device. The system can be powered by battery such that it is practical for the device to function as a locating device, continuously monitoring for the locating phrase. Voice recognition can be performed completely within the system, providing the benefit of privacy.

13 Claims, 6 Drawing Sheets

Related U.S. Application Data filed on Sep. 14, 2018, provisional application No. 62/731,681, filed on Sep. 14, 2018, provisional application No. 62/731,670, filed on Sep. 14, 2018, provisional application No. 62/731,657, filed on Sep. 14, 2018.

(51) Int. Cl.

| | | |
|---|---|---|
| *G06N 3/063* | (2023.01) | |
| *G10L 15/08* | (2006.01) | |
| *G10L 15/16* | (2006.01) | |
| *G10L 15/30* | (2013.01) | |
| *G10L 25/30* | (2013.01) | |
| *G10L 25/78* | (2013.01) | |
| *H03M 1/12* | (2006.01) | |

(52) U.S. Cl.
CPC .............. *G10L 15/16* (2013.01); *G10L 15/30* (2013.01); *G10L 25/30* (2013.01); *G10L 25/78* (2013.01); *H03M 1/12* (2013.01); *G10L 2015/088* (2013.01); *G10L 2015/223* (2013.01)

(58) Field of Classification Search
CPC ........ G10L 2015/088; G10L 2015/223; G06N 3/02; G06N 3/063; G06N 3/044; G06N 3/045; H03M 1/12; G06F 3/167
See application file for complete search history.

(56) References Cited

U.S. PATENT DOCUMENTS

| | | | |
|---|---|---|---|
| 11,043,086 B1* | 6/2021 | Daoura | G08B 21/24 |
| 2009/0002222 A1* | 1/2009 | Colburn | G01C 9/00 |
| | | | 342/146 |
| 2012/0326282 A1* | 12/2012 | Sutardja | G11C 5/063 |
| | | | 257/E21.705 |
| 2014/0222436 A1 | 8/2014 | Binder et al. | |
| 2014/0358552 A1 | 12/2014 | Xu | |
| 2018/0097493 A1 | 4/2018 | Weksler et al. | |
| 2018/0180752 A1 | 6/2018 | Gabai | |
| 2019/0015005 A1* | 1/2019 | Moon | A61B 5/25 |
| 2019/0081621 A1* | 3/2019 | Schinkel | H03M 1/1245 |
| 2019/0325898 A1* | 10/2019 | O'Hart Kinney | G10L 15/02 |
| 2020/0021913 A1* | 1/2020 | Shah | H04S 7/302 |

* cited by examiner

SYSTEM ARCHITECTURE AND EMBEDDED CIRCUIT TO LOCATE A LOST PORTABLE DEVICE USING VOICE COMMAND

CROSS-REFERENCE TO RELATED APPLICATIONS

This application is a national stage application, filed under 35 U.S.C. § 371, of International Patent Application No. PCT/US/2019/050981, filed on Sep. 13, 2019 which claims priority under 35 U.S.C. § 119 (e) to U.S. Provisional Patent Application No. 62/772,476 filed on Nov. 28, 2018, U.S. Provisional Patent Application No. 62/731,681 filed on Sep. 14, 2018, U.S. Provisional Patent Application No. 62/731,657 filed on Sep. 14, 2018, U.S. Provisional Patent Application No. 62/731,666 filed on Sep. 14, 2018, and U.S. Provisional Patent Application No. 62/731,670 filed on Sep. 14, 2018, the entire contents of which are incorporated herein by reference.

BACKGROUND

The present application relates to a locating portable devices using a voice command.

Desktop computers are typically placed on or next to a desk, and due to their weight and power requirements of being plugged into household power, they are not considered mobile devices. When it is desired to use such desktop computers, the user walks over to the desktop computer and performs whatever tasks are desired. Due to the size and non-portability of a desktop computer, they are easy to locate.

Laptop computers are typically placed on a desk or any other flat surface, and due to their weight and battery power are not plugged into household power continuously and are considered mobile devices. When it is desired to use such laptop computers, the user walks over to the surface where the laptop is located and performs whatever tasks are desired. Due to the size of a laptop, they are often easy to locate.

Highly portable devices, such as a smartwatch, a smartphone, a tablet computer, a remote controller, a computerized toy, and the like are battery powered and are typically not placed in any particular location. For example, a smartphone can be left in nearly any location within a home depending on where it was last used or otherwise set down. When it is desired to use such highly portable devices, the user often needs to search for the device attempting to locate the last location it was placed, often without much success. Accordingly, such highly portable devices are often misplaced which may require substantial effort to locate.

A standalone finder device may be obtained separately from the portable device. The finder device may be used to locate the portable device. Upon request such as pushing a button on the finder, the finder device may assist in locating the portable device by communicating wirelessly, such as through WiFi or Bluetooth, with the portable device. The portable device in response to receiving a communication from the finder device will generate an audible beeping sound which the user can hear in order to locate the portable device. While a standalone finder is functional, it is problematic to locate the standalone finder each time the portable device is misplaced, especially in a location remote from where the standalone finder is located. Moreover, for multiple devices it would require multiple standalone finder devices, which is burdensome for the user.

SUMMARY

An example system on a chip (SoC) can include an input pad, a decimation module, a wake-up phrase detection module, a waveform generator, a speaker amplifier, a control interface, control interface input pads, a pair of power input pads, and an output pad. The input pad can be connected to the decimation module to provide an audio stream to the decimation module. The decimation module can be connected to the waveform generator to provide the audio stream in decimated form to the wake-up phrase detection module. The wake-up phrase detection module can be connected to the waveform generator to provide an interrupt signal to the waveform generator. The waveform generator can be connected to the speaker amplifier to provide an electrical signal to the speaker amplifier. The speaker amplifier can be connected to the output pad to provide the electrical signal, amplified, to the output pad. The amplified electrical signal can be a signal that when received by a speaker, generates an audible alert tone or melody. The power input pads can be connected to the analogue to digital converter, the decimation module, the wake-up phrase detection module, the waveform generator, and the control interface to provide power to each.

The SoC can further include electrical traces to facilitate the aforementioned connections and a semiconductor substrate structurally supporting the input pad, decimation module, wake-up phrase detection module, waveform generator, speaker amplifier, control interface, control interface pads, power input pads, and output pads. The SoC can be effective to provide voice recognition of at least one phrase and an alert response when powered through the pair of power pins, fed a digital audio signal through the input pad, and connected to a speaker at the output pad without requiring any additional components.

In another example, the SoC can additionally include an analogue to digital converter connected to the input pad and the decimation module. In the example, the decimation module need not be connected to the input pad. The analogue to digital converter can receive an analogue audio signal and convert the analogue audio signal to a digital audio signal. The SoC can be effective to provide voice recognition of at least one phrase and an alert response when powered through the pair of power pins, fed an analogue audio signal through the input pad, and connected to a speaker at the output pad without requiring any additional components.

The analogue to digital converter can be configured to receive an analogue audio signal and generate a pulse density modulation (PDM) signal based on the analogue audio signal.

The decimation module can be configured to receive a PDM signal, either from the input pad (e.g. if the SoC lacks an analogue to digital converter) or from the analogue to digital converter. The decimation module can be configured to generate a pulse code modulation (PCM) signal based on the PDM signal.

The wake-up phrase detection module can be configured to receive a decimated signal from the decimation module, detect a locating phrase in the decimated signal, and provide an interrupt signal upon detecting the locating phrase. The decimated signal can be a PCM signal generated by the decimation module. The wake-up phrase detection module can be configured to provide the interrupt signal only upon detecting the locating phrase. The locating phrase can be the only phrase which the wake-up phrase detection module is configured to detect.

The wake-up phrase detection module can include a neural network hardware topology. The neural network hardware topology can be hardwired to receive a decimated signal from the decimation module and detect a locating phrase in the decimated signal. The neural network topology can include a convolution topology, a recurrent neural network, other suitable type of neural network as would be appreciated and understood to a person of ordinary skill in the art according to the teachings of the present disclosure, or combination of the aforementioned neural networks.

The waveform generator can be configured to receive the interrupt signal from the wake-up phrase detection module. In response to receiving the interrupt signal, the waveform generator can provide an electrical signal, that when provided to a speaker can produce an audible tone or melody. Additionally, or alternatively, in response to receiving the interrupt signal, the waveform generator can provide an electrical signal having a frequency greater than 20 Hz and less than 20 kHz. The waveform generator can include an oscillator. The electrical signal can be representative of a melody.

An example portable electronic device can include the SoC (with or without the analogue to digital converter). The portable electronic device can lack a network transceiver. The portable electronic device need not include a network transceiver to be effective to provide voice recognition of at least one phrase and provide an alert response.

An example portable electronic device can include the SoC (with or without the analogue to digital converter), an audio transducer connected to the input pad, a speaker connected to the output pad, a battery connected to the pair of power input pads, wiring facilitating the connections between the SoC, audio transducer, speaker, and battery, and a housing containing the audio transducer, speaker, battery, and wiring. The portable electronic device can have only the SoC, audio transducer, speaker, battery, wiring, and housing and be effective to provide voice recognition of at least on phrase and provide an alert response.

An example method can include one or more of the following steps presented in no specific order and can potentially include additional steps. An electronic device can perform the steps of transducing acoustics impending on the electronic device into an audio stream, monitoring the audio stream for the presence of a locating phrase, generating an audible tone in response to detecting the presence of the locating phrase in the audio stream. The electronic device can be powered solely by battery.

Monitoring the audio stream can include analyzing the audio stream, via hardware, for the presence of the locating phrase.

Monitoring the audio stream can include monitoring for the presence of the locating phase such that the locating phrase is the sole phrase for which the presence is monitored by the electronic device.

The electronic device can also perform the steps of generating a PDM signal based on the audio stream as a result of transducing the audio stream and generating a PCM signal based on the audio stream. Monitoring the audio stream for the presence of the locating phrase can be accomplished by monitoring the PCM signal for the presence of the locating phrase.

The electronic device can also generate an interrupt signal in response to detecting the presence of the locating phrase in the audio stream while monitoring the audio stream for the presence of the locating phrase.

DETAILED DESCRIPTION

Figure 1:
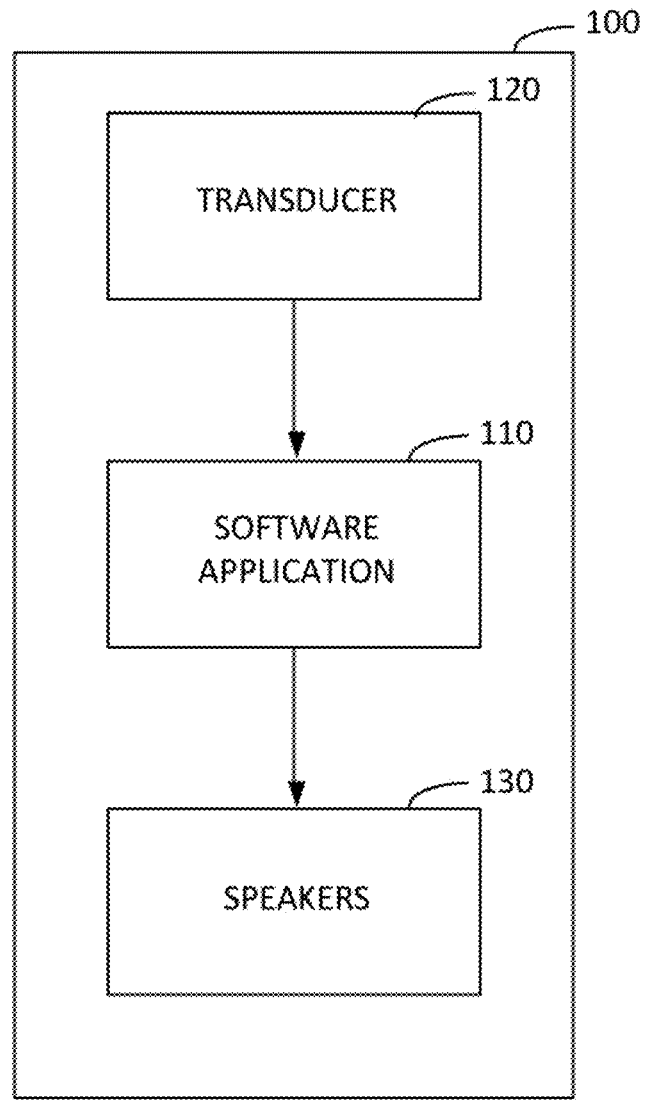
FIG. 1 illustrates a portable device with location identification.

As used herein, an "audio signal" is understood to mean an electrical signal that is representative of a sound carried by acoustic waves. For instance, an "audio signal" can be an electrical signal provided by an acoustic transducer such as a microphone, an analogue electrical signal, a digital electrical signal, an analogue electrical signal that has been digitized, an electrical signal that has been amplified, an electrical signal that has been filtered, an electrical signal that has been sampled, and/or an electrical signal that has been decimated.

As used herein, an "audio stream" is understood to mean an "audio signal" that is continuously provided and/or generated. For instance, an "audio stream" can be an "audio signal" that is a real-time representation of acoustic waves impending on an acoustic transducer.

As used herein, "network transceiver" is understood to mean a component configured to communicate with a system such that the system and/or network is outside of the control of the user. For instance, a device having a network transceiver can be configured to communicate with a cloud based computing device, with a third-party server, or over an unsecure network. A device lacking a network transceiver would therefore not be able to communicate with a cloud based computing device, other device or server that is not under the control of the user, or over an unsecure network. Lacking a network transceiver need not necessarily mean that the device lacks any and all networking capabilities if such networking capabilities are configured such that the device communicates only with other devices within a system that is under the control of the user.

As used herein, "comprising", "including," "containing," and "characterized by," are each inclusive or open-ended and do not exclude additional, unrecited elements or method steps. Such terms allow for the inclusion of other, unspecified elements or steps, even when those elements and steps are in major amounts or are otherwise significant.

As used herein, "consisting of" excludes any element, step, or ingredient not specified while allowing for impurities ordinarily associated with specified elements, steps, and ingredients. Further, a device, system, or process "consisting of" certain elements, steps, or ingredients can be combined with accessory elements, steps, or ingredients and remain in keeping with the meaning of the term. When the phrase "consisting of" appears in a clause of the body of a claim, rather than immediately following the preamble, it limits only the element set forth in that clause; other elements are not excluded from the claim as a whole.

As used herein, "consisting essentially of" excludes any element, step, or ingredient not specified while allowing for impurities ordinarily associated with specified elements, steps, and ingredients and also allowing for elements, materials, or steps that do not materially affect the basic and novel characteristic(s) of the combination of the specified elements, steps, and ingredients. As used herein, "consisting essentially of" thereby occupies a middle ground between the essentially exclusive term "consisting of" and the wholly inclusive term "comprising".

Referring to FIG. 1, one technique to locate a battery powered portable device 100, such as a smartwatch, a smartphone, a tablet computer, a remote controller, a computerized toy, and the like is to include a software application 110 that is continuously running on the portable device 100. The software application 110 monitors a transducer 120, such as a microphone, on the portable device 100 to detect a key-phrase spoken by a user. The key-phrase may be, for example, "Where Is My Phone". In response to sensing the key-phrase, the portable device 100 may alert its location to the user by causing a particular sound, such as a ring tone, to be played on the speakers 130 of the portable device. The user, upon hearing the sound from the speakers 130, may readily seek out the portable device. Unfortunately, the software application continuously running on the portable device tends to have relatively high power consumption resulting in relatively limited battery life. A potential advantage of device 100 performing key-phrase detection on the device is that the device need not reach out to a network in order to perform key-phrase detection, maintaining user privacy. The device 100 can completely lack a network transceiver, in which case the user can be completely assured that the device 100 is not sending audio signals to any party.

Figure 2:
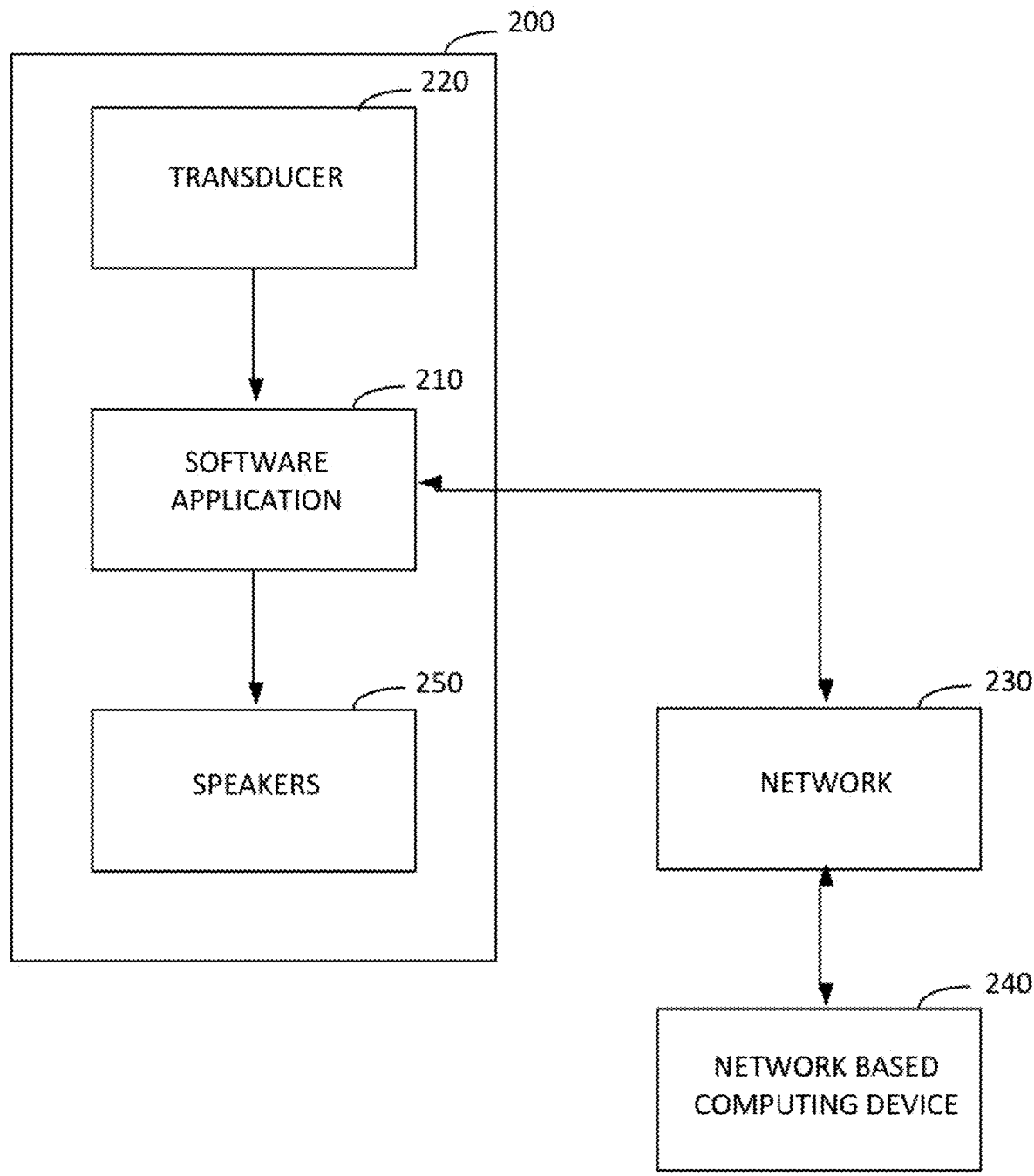
FIG. 2 illustrates another portable device with location identification.

Referring to FIG. 2, another technique to locate a battery powered portable device 200, such as a smartwatch, a smartphone, a tablet computer, a remote controller, a computerized toy, and the like is to include a software application 210 that is continuously running on the portable device 200. The software application 210 monitors a transducer 220, such as a microphone, on the portable device 200 to provide an audio stream from the transducer 200 to a network 230 (e.g., the Internet) based computing device (e.g., a cloud server) 240. The network based computing device 240 detects a key-phrase spoken by a user. The key-phrase may be, for example, "Where Is My Phone". In response to detecting the key-phrase, the network based computing device 240 may send a command to the portable device 200 to alert its location to the user by causing a particular sound, such as a ring tone, to be played on the speakers 250 of the portable device. The user, upon hearing the sound from the speakers 250, may readily seek out the portable device. Unfortunately, the software application continuously running on the portable device and the audio provided through the network connection tends to have relatively high power consumption resulting in relatively limited battery life. In addition, transmitting the audio stream across the network compromises the user's privacy, and has limited reliability because of the dependence of limited network connectivity.

Figure 3:
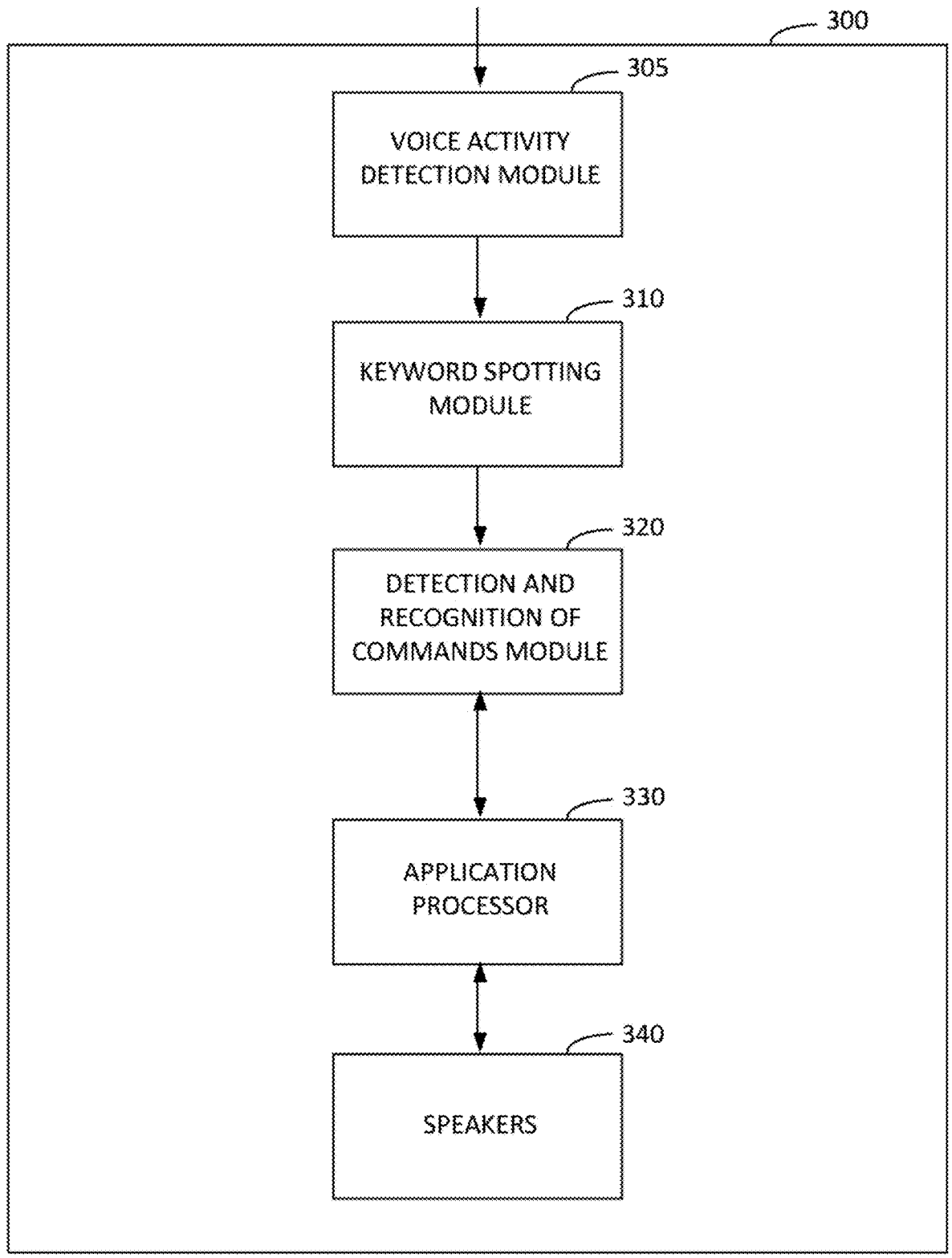
FIG. 3 illustrates yet another portable device with location identification.

Referring to FIG. 3, to reduce the power requirements, while still permitting the capability of receiving a voice command, the portable device 300 may include a voice activity detection (VAD) input module 305. The voice activity detection (VAD), also generally referred to as speech activity detection or speech detection, is a technique used for speech processing in which the presence of human speech or the lack thereof of human speech is detected. The principal applications for voice activity detection is for speech coding, speech processing, and speech recognition. Various VAD techniques have been developed to provide different features. Each of the various VAD techniques often includes formulating a decision on a frame by frame basis using instantaneous measures of the divergence between the speech and the noise. There are many different divergence measures that may be used, such as for example, spectral slope, cepstral, correlation coefficients, weighted cepstral, log likelihood ratio, and modified distance measures.

In addition to the choice of the VAD technique, the system also typically makes a choice between having voice detected as noise or noise detected as voice (e.g., a choice between a false positive and a false negative). One example of a VAD technique to detect speech is described in Ramirez J, Segura J, Benitez C, De La Torre A, Rubio A: "Efficient voice activity detection algorithms using long-term speech information", in Speech Communications, Vol. 42, pp. 271-287, 2004, incorporated by reference herein in its entirety.

In general, each of the VAD techniques detect the presence of human speech or the absence of human speech. One advantage of using the VAD based technique includes lowering the system power because the system is maintained in an idle mode until speech is detected. Another advantage of using the VAD based technique includes securing the user privacy by blocking sound streaming until speech is detected, after which it enables a second stage that checks whether the user is addressing the device with a "wake word".

The voice activity detection module 305 is preferably included within the device, such as a smartphone. Upon detecting the occurrence of voice activity by the voice activity detection module 305, a keyword spotting module 310 monitors the subsequent voice activity for a period of time for a keyword/trigger word/wake-word or the like (generally referred to herein as a wake word). The keyword spotting module 310 is preferably included within the device, such as a smartphone. If such a wake word is not detected during the subsequent period of time, the system resumes its voice activity monitoring by the voice activity detection module 305 for the next voice activity. If such a wake word is detected during the subsequent period of time by the keyword spotting module 310, then the audio stream is processed by a detection and recognition of commands module 320 to detect and recognize subsequent commands during for a period of time. The subsequent commands are processed, and based upon the content of the commands indicating a desire to find the device, such as "Baymax Find My Smartwatch" (e.g., wake word is "Baymax" and command is "Find My Smartwatch"), a sign such as in the form of an interrupt is used to wake up an application processor 330 of the device. A software driver or a hardware logic is then enabled to a playback path including the speaker 340 to play a sound. The sound is preferably selected from samples stored in a memory or by an oscillator circuit. Preferably, the interface to the application processor includes a GPIOs or with an additional interface to transmit a buffered data to the application processor for a second validation of the key phrase.

Preferably the voice command recognition is implemented using digital signal processing functionalities such as Hidden Markov Models (HMM) or a neural network circuit. Preferably the processing includes feature extraction of the received audio signals, such as Mel-band coefficients or any other spectral representations. The neural network may be implemented as a convolutional neural network or as a recurrent neural network, or any other suitable type of neural network. The voice command recognition techniques may be implemented in a standalone chip, in a codec chip, in the microphone, in the speaker, or integrated in a power island in the application processor. As it may be observed, preferably the portable device 300 includes all the processing necessary to provide the signal to the speakers to indicate the portable device's location.

Since the voice commands need to be captured by the microphone of the portable device, the user's proximity to the portable device should be within an acceptable distance, such as within 15 feet.

Preferably, each portable device or class of portable devices, has a unique command that it is responsive to. By way of example, a smartphone may include "Baymax Find My Smartphone". By way of example, a tablet may include "Baymax Find My Tablet". By way of example, a TV controller may include "Baymax Find My Controller". In this manner, each device that receives the audible command can distinguish whether it is the likely intended recipient.

Figure 4:
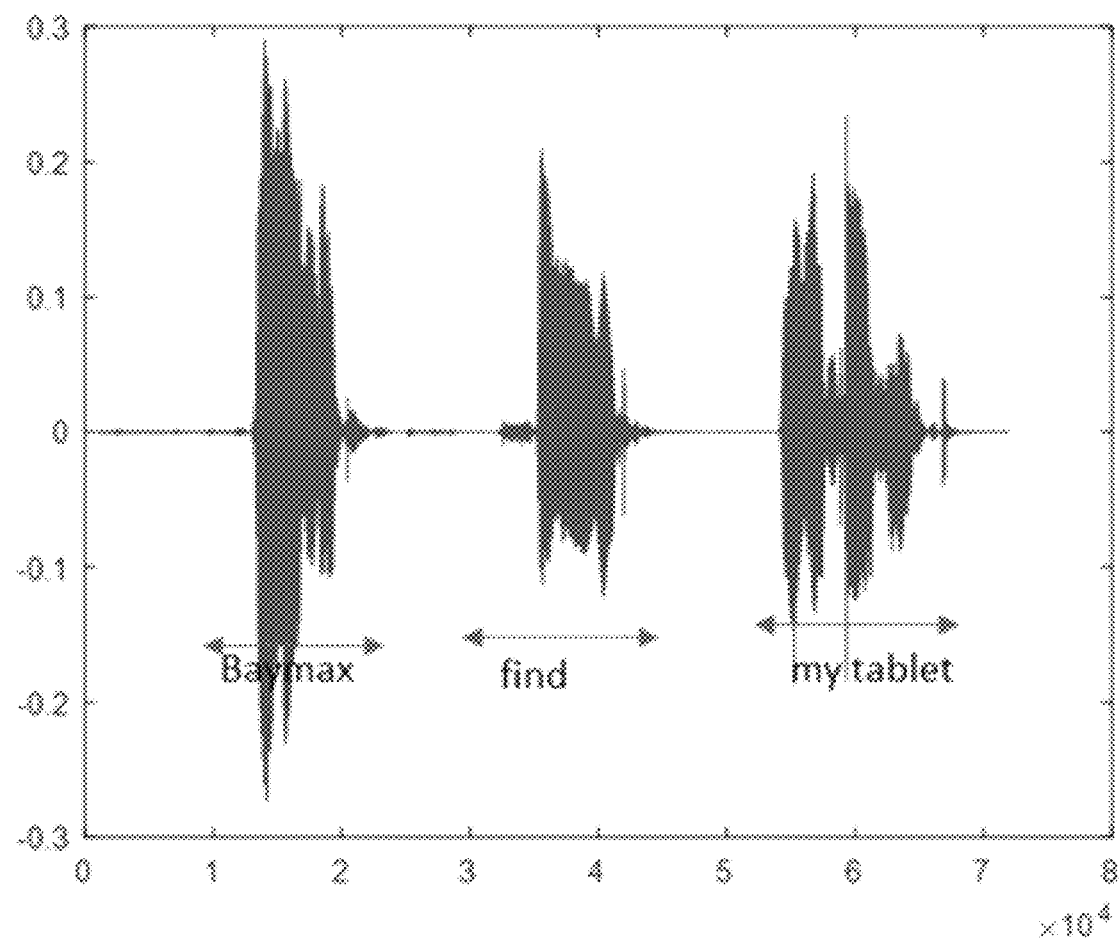
FIG. 4 illustrates a key-phase detection.

Referring to FIG. 4, an example is illustrated of the key-phrase "Baymax find my tablet".

In a preferred embodiment, the portable device 300 does not include an external finder device. Also, the portable device 300 includes the necessary circuitry and/or software built-in to the portable device 300 with no need for an external accessory.

In a preferred embodiment, the always on hardware circuit for receiving the wake word, and including the command if desired, requires substantially lower power than keeping an application running in the software layer of the device which mandates the application processor to remain on all the time.

In a preferred embodiment, the audio stream is not sent off the portable device to any other device, including a network based computing device, which increases the privacy of the user's data.

In a preferred embodiment, the audio stream is processed entirely within the portable device, which reduces the latency of the device which would otherwise be necessary with a network.

In a preferred embodiment, the reliability of the device is increased because the portable device does not depend on network connectivity to provide an indication of its location.

Figure 5:
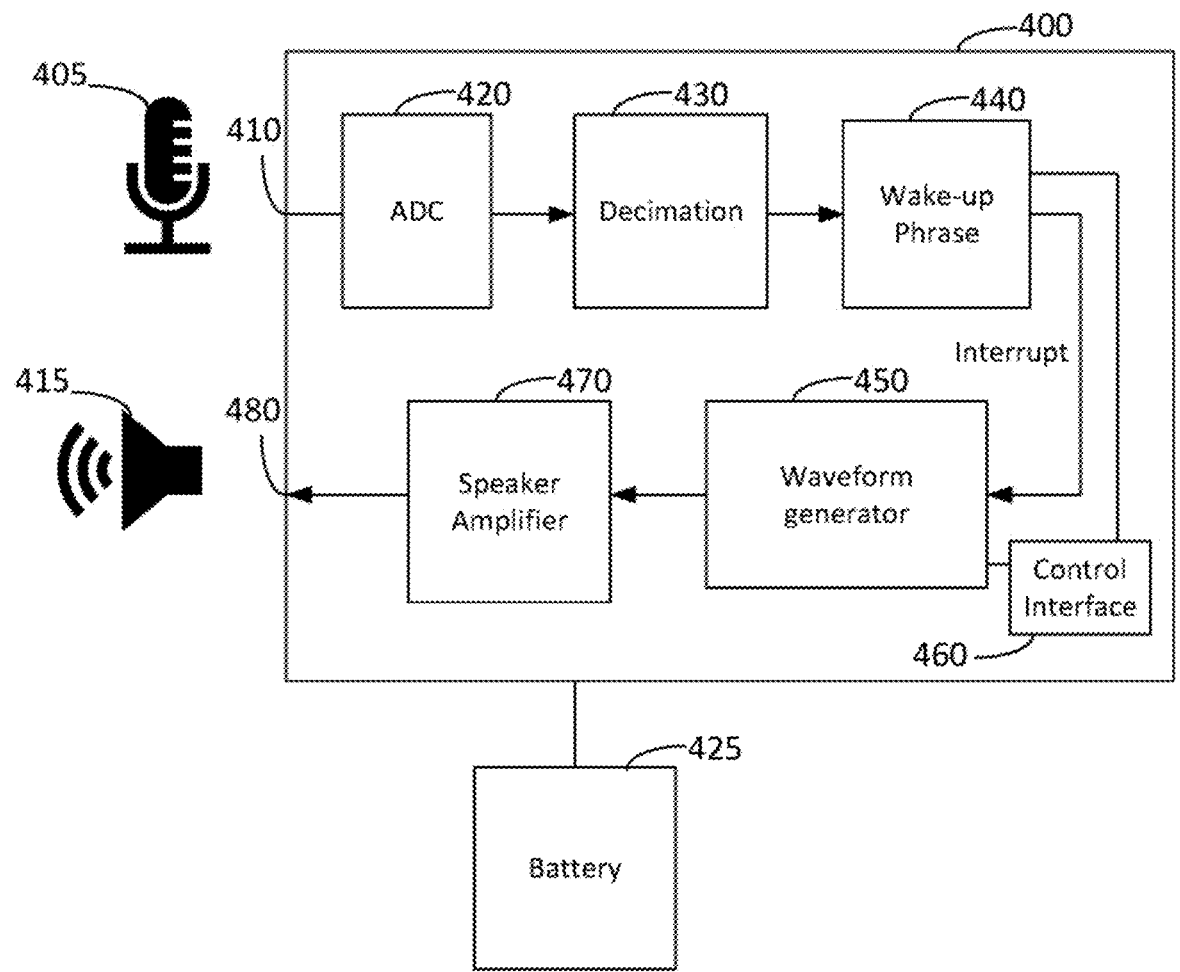
FIG. 5 illustrates a circuit with location identification.

Referring to FIG. 5, an example circuit 400 is illustrated with voice activated location functionality. In a preferred embodiment, the circuit 400 can be included on a single printed circuit board, within a single packaged device (e.g. a package mountable on a printed circuit board), and/or on a single chip as a system on a chip. The circuit 400 can be embedded in a portable device such as the portable device 300 illustrated in FIGS. 1 through 3 or other portable device as would be appreciated and understood by a person of ordinary skill in the art. The circuit 400 can include a microphone input 410, an analogue to digital converter 420, a decimation module 430, a wake-up phrase detection module 440, a waveform generator 450, a speaker amplifier 470, and a control interface 460. The circuit 400 can be configured to be powered solely by a battery 425.

The microphone input 410 can receive an input from a digital and/or an analogue microphone 405. The input can be an audio signal, or more specifically an audio stream, as defined herein. In the case that the microphone input 410 is configured to receive an audio signal from an analogue microphone 405, the circuit 400 can include an analogue to digital signal converter 420.

The circuit 400 can be configured to be connected to a microphone 405 that is capable of providing an audio signal based on receiving acoustics of a user's voice when the user is speaking at a comfortable speaking volume and when the user is within an acceptable distance, such as within 15 feet.

The decimation module 430 can receive a digital audio signal either directly from the microphone input 410 or from the analogue to digital signal converter 420. The digital audio signal can be an audio signal, or more specifically an audio stream as defined herein. The decimation module can decimate the digital audio signal from a pulse density modulation (PDM) signal to a pulse code modulation (PCM) signal. The decimated signal can be an audio signal, or more specifically an audio stream, as defined herein.

The wake-up phrase detection module 440 can receive the decimated signal from the decimation module 430. The wake-up phrase detection module 440 can monitor the decimation signal for a locating word or phrase (referred to herein for simplicity as "locating phrase"). The locating phrase can be predetermined. The locating phrase can be specific to the circuit 400. When the wake-up phrase detection module 440 detects the predetermined wake phrase in the decimated signal, the wake-up phrase module 440 can provide an interrupt command.

In some embodiments of circuit 400, the locating phrase can include a wake word and command phrase such as illustrated in FIG. 4, as described in relation to FIGS. 1 through 3, or as otherwise would be appreciated and understood by a person of ordinary skill in the art. The locating phrase can be tailored for the type of object for which the circuit 400 is configured to find. For instance, for a circuit 400 configured to find a smart phone, the locating phrase can be "Baymax Find My Smartphone". In another example, for a circuit 400 configured to find a tablet, the locating phrase can be "Baymax Find My Tablet". In another example, for a circuit 400 configured to find a TV controller, the locating phrase can be "Baymax Find My Controller".

In preferred embodiment, the circuit 400 can be configured to respond to a singular locating phrase. The wake-up phrase module 440 can be configured to respond solely to the singular locating phrase. The singular locating phrase can be selected by a device manufacturer. The device manufacturer can produce collections of devices such that each collection responds to the same singular locating phrase (e.g. "Find My Phone") and other collections respond to a different singular locating phrase (e.g. "Find My Wallet"). The wake-up phrase module 440 can be configured to monitor the decimated signal for the singular locating phrase without requiring that the singular locating phrase include a wake word and a command. In other words, the singular locating phrase can be monitored, as a whole, by the wake-up phrase module 440, and the singular locating phrase need not be broken out into a wake word and a command that are monitored by separately. In this embodiment, this functionality can be accomplished because the wake-up phrase module 440 is configured to respond to only one locating phrase and provide only one command instruction (e.g. an interrupt) as opposed to systems that are configured to listen for and detect multiple command phrases and provide different command instructions based on the command phrase detected. Stated another way, the singular locating phrase can act as a "wake word" as described in relation to FIGS. 1 through 3, and rather than determining which command to execute based on a "command phrase", the wake-up phrase module 440 provides an interrupt command when activated by the singular locating phrase.

The singular locating phrase can be tailored for the type of object for which the circuit 400 is configured to find. For instance, for a circuit 400 configured to find a smart phone, the singular locating phrase can be "Find My Smart Phone". In another example, for a circuit 400 configured to find a tablet, the singular predetermined phrase can be "Find My Tablet." In another example, for a circuit 400 configured to find a TV controller, the singular predetermined phrase can be "Find My Controller."

In a preferred embodiment, the wake-up phrase module 440 can be a custom circuit configured to receive an audio signal, continuously monitor the audio signal for the singular locating phrase and provide the interrupt signal when the singular predetermined phrase is detected by the wake-up phrase module 440.

Preferably the wake-up phrase detection module 440 is implemented using digital signal processing functionalities such as Hidden Markov Models (HMM) or a neural network circuit. Preferably the processing includes feature extraction of the received audio signals, such as Mel-band coefficients or any other spectral representations. The neural network can be implemented as a convolutional neural network or as a recurrent neural network, or any other suitable type of neural network.

The circuit 400 can include a waveform generator 450 that can receive the interrupt command from the wake-up phrase module 440. The waveform generator 450 can provide an electrical signal that when provided to a speaker 415, can produce an audible an alert tone or melody.

The signal provided from the waveform generator 450 can be directly provided to an output 480 of the circuit, and/or the circuit can include a speaker amplifier 470 that can receive the alert signal provided from the waveform generator 450, amplify the alert signal (e.g. voltage and/or current amplification), and provide the amplified alert signal to the circuit output 480. For instance, the waveform generator can include an oscillator that can generate a periodic electrical signal. The waveform generator 450 can cause the oscillator to generate the periodic electrical signal as the alert signal in response to receiving the interrupt signal from the wake-up phrase detection module 440.

The output 480 of the circuit 400 can be configured for connecting to a compatible speaker 415 such that, when the alert signal (e.g. amplified alert signal) is provided to the speaker 415, the speaker 415 can produce an acoustic alert tone having sufficient volume and frequency tone(s) as to be effective for finding the circuit 400. An effective volume and tone can be for instance, about as loud as current ring tone and alert volumes on a cellular telephone, an alarm volume on an alarm clock, and up to about as loud as a household smoke detector. The circuit 400 can include all the processing necessary to provide the alert signal to the speaker 415 to indicate the portable device's location.

In some examples, the predetermined command phrase and/or the alert signal can be predetermined by hardware and/or firmware without requiring a user interface to the circuit 400. Additionally, or alternatively, the circuit 400 can include a control interface 460 that can provide a means for selecting or otherwise inputting the predetermined command phrase (e.g. singular locating phrase) and/or alert signal. In some embodiments, the control interface 460 can include a one-time programmable memory to store settings such as the location phrase and the alert tone for the circuit 400. In some embodiments, the control interface 460 can include an I2C or other such interface, a microcontroller, and memory. The memory can be programmable with and/or include a selection of command phrases and/or alert signals. As would be appreciated and understood by a person of ordinary skill in the art, a one-time programmable memory can provide a more simplistic design that can be less expensive to manufacture and more compact as a final product; while a more complex, programmable circuit can allow for greater configurability.

In some embodiments, particularly when the circuit 400 is included an a portable device, the circuit can be configured by the device manufacturer via the control interface 460 to respond to a particular locating phrase and/or to output an alert signal. Additionally, or alternatively, the portable device can be configured to provide an end user a means for selecting and/or programming the locating phrase and/or alert signal. As would be appreciated and understood by a person of ordinary skill in the art, a portable device having a circuit 400 configured by the device manufacturer without a user interface to the control interface 460 can provide a more simplistic design that can be less expensive to manufacture and more compact as a final product; while a device with a user interface to the control interface 460 can allow for greater configurability and user features.

The circuit 400 can further be configured to operate on battery power 425. The battery 425 can be embedded in or otherwise affixed to a system including the circuit 400. Alternatively, the battery can be replaceable and the system can include a receptacle configured to receive the battery 425 and allow the removal and replacement of the battery 425 by a user. The battery 425 can be rechargeable or single use. The system can include a circuit for recharging the battery 425, and/or the battery 425 can be removable for recharging by a charger external to the system. The circuit 400 can be powered on upon connection to battery 425.

The circuit 400, microphone 405, the speaker 415, and the battery 425 (or a receptacle configured to receive the battery 425) can be packaged together in a singular container, mounted on a single printed circuit board, or otherwise affixed to each other as a single unit. Configured thusly, a system including the circuit 400, microphone 405, speaker 415, and battery 425 can be affixed to, embedded within, or detachably attached to a portable object. For instance, the system can be affixed to, embedded within, or detachably attached to a backpack, wallet, purse, luggage, lunch box, tool box, pencil case, key, camera, jacket, shoe, hat, umbrella, laptop charger, laptop computer, phone charger, toy, book, scissors, pen, pencil, marker, mug, lantern, flashlight, pacifier, pet collar, jewelry, radio frequency (RF) badge, drill, screwdriver, hammer, and other such object that a person may want to find according to the principles disclosed herein.

The circuit 400, microphone 405, speaker 415, and battery 425 can be sized such that when assembled as a system, the system has a form factor compatible to be affixed to, embedded within, or detachably attached to a portable object such as one of the portable objects disclosed herein. The circuit 400 can further be configured to operate, in an always-on fashion, continuously monitoring for the predetermined command phrase and continuously powered by the battery 425 for hours, days, weeks, months, or years.

Systems disclosed herein may additionally, or alternatively, be implemented using a computer-readable medium and a processor as would be appreciated and understood by a person of ordinary skill in the art according to the teachings herein. The computer-readable medium may be any available medium that may be accessed by the processor. The computer-readable medium may include both a volatile and a nonvolatile medium, a removable and non-removable medium, and a storage medium. The storage medium may include RAM, flash memory, ROM, erasable programmable read-only memory (EPROM), electrically erasable programmable read-only memory (EEPROM), registers, hard disk, a removable disk, a compact disk read-only memory (CD-ROM), or any other form of storage medium. The processor may be operatively coupled via a bus to a display, such as a Liquid Crystal Display (LCD). The display may display information to the user. A keyboard and a cursor control device, such as a touch screen, can also be operatively coupled to bus to enable the user to interface with system.

The processor may be operatively coupled via the bus to one or more databases. The database may store data in an integrated collection of logically-related records or files. The database may be an operational database, an analytical database, a data warehouse, a distributed database, an end-user database, an external database, a navigational database, an in-memory database, a document-oriented database, a real-time database, a relational database, an object-oriented database, a NoSQL database, or any other database, or any combination thereof.

The memory may store software modules that provide functionality when executed in combination with the processor. The modules can include a data visualization module. The data visualization module may include a data visualization application that can collect, organize, synchronize, and display case data. The data visualization module may comprise a plurality of modules that each provide specific individual functionality for collecting, organizing, synchronizing, entering, modifying, and displaying data. The memory may also store an operating system. The operating system may provide operating system functionality for the system. The memory may also store one or more additional applications to include additional functionality for an overall system.

Figure 6:
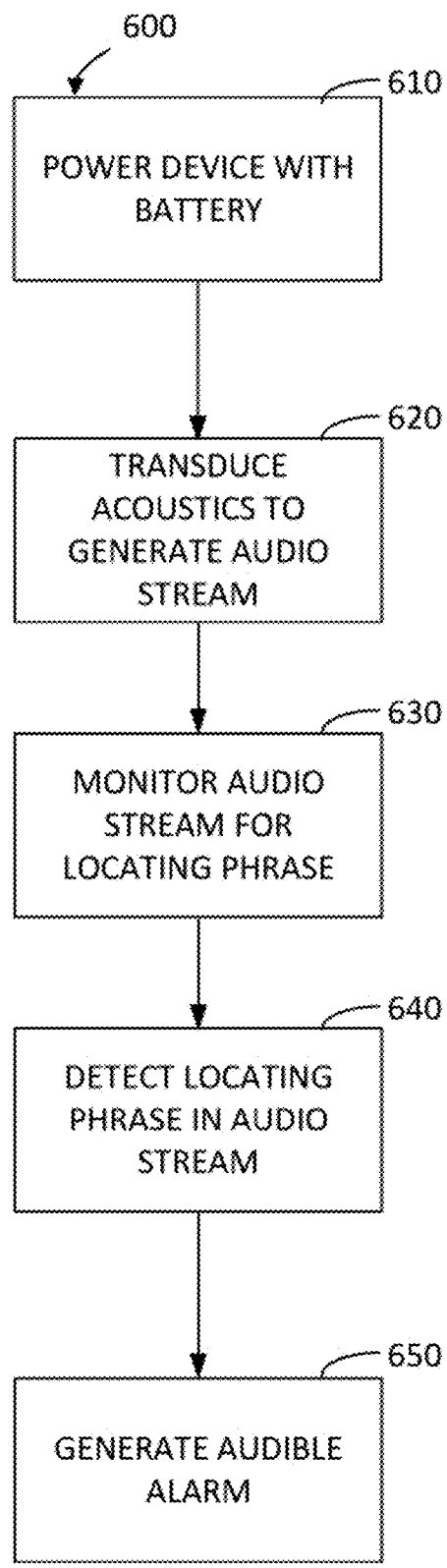
FIG. 6 illustrates a method for locating an electronic device.

Referring to FIG. 6, a method 600 for locating a lost electronic device can include the following steps. The steps can be executed in various orders as would be appreciated and understood by a person of ordinary skill in the art according the teachings of this disclosure. One or more of the steps can be executed by a portable device as illustrated and described herein, variations thereof, and alternatives thereof as would be appreciated and understood by a person of ordinary skill in the art according to teachings of the present disclosure.

At step 610, a portable device can be powered by a battery. The portable device can include a system for locating the device such as the systems 100, 200, 300, 400 illustrated and described herein, variations thereof, and alternatives thereof as would be appreciated and understood by a person of ordinary skill in the art according to teachings of the present disclosure. A system within the portable device can be powered by battery by virtue of the portable device being powered by battery. The battery can provide the sole means for powering the system and the portable device. In other words, the method steps of method 500 can be executed, consuming sufficiently low power, such that the steps can be executed by a portable device, for a sufficient amount of time to function as a locating device, while powered solely by battery. The device can be powered continuously while the battery is connected. The battery can be connected by pulling a tab to cause contacts of the battery to power the device and/or the device can include a power button. If the device includes a power button, the device can be powered on and remain on until the battery is drained. Alternatively, if the device includes a power button, the power button can be pressed to turn the device off.

At step 620, acoustics impending on the electronic device can be transduced into an audio stream. The electronic device, once powered as in at step 610, can continuously generate the audio stream. In other words, when powered, the electronic device is always listening.

At step 630, the audio stream can be monitored for the presence of a locating phrase. The monitoring for the presence of the locating phrase can include voice recognition strategies as disclosed herein, variations thereof, and alternatives thereof as would be appreciated and understood by a person of ordinary skill in the art according to teachings of the present disclosure. Monitoring can be performed to recognize only the locating phrase, or a small number of predetermined phrases. The monitoring can be performed by a system customized for this specific application, such that the voice recognition consumes lower power than a more robust voice recognition system or a generic computing system executing software-based voice recognition.

At step 640, the locating phrase can be detected in the audio stream. The locating phrase can be detected as a result of the monitoring and using voice recognition strategies as disclosed herein, variations thereof, and alternatives thereof as would be appreciated and understood by a person of ordinary skill in the art according to teachings of the present disclosure.

At step 650, once the locating phrase is detected, the portable device can generate an audible alarm with sufficient volume and within audible hearing range (between 20 Hz and 20 kHz) such that a person could effectively hear and locate the device.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention. Project type configurations may be created automatically by the system or by the user of the system through an interface. The resulting project types may result in outputs suitable for use in the data models and the workflow models.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

What is claimed is:

1. A system on a chip (SoC) embeddable into a portable electronic device, comprising:
    an input microphone pad;
    a decimator connected to the input microphone pad;
    a wake-up phrase detector connected to the decimator that identifies, in response to voice activity detection, an input of a pre-selected locating phrase, the wake-up phrase detector operating continuously in a low power mode while in voice activity detection and activating a machine learning model to solely identify the pre-selected locating phrase in its entirety without segmentation and generate a corresponding interrupt signal in response;
    a waveform generator connected to the wake-up phrase detector solely responsive to the interrupt signal generated by the wake-up phrase detector;
    a speaker amplifier connected to the waveform generator;

a control interface connected to the waveform generator and the wake-up phrase detector;
control interface input pads connected to the control interface;
an output pad connected to the waveform generator; and
a semiconductor substrate structurally supporting the input microphone pad, the decimator, the wake-up phrase detector, the waveform generator, the control interface, and the output pad.

2. A portable electronic device comprising the SoC of claim 1 and operational without a network transceiver.

3. A portable electronic device comprising:
the SoC of claim 1;
an audio transducer connected to the input microphone pad;
a speaker connected to the output pad;
a battery connected to a pair of power input pads;
wiring facilitating connections between the SoC and the audio transducer, the speaker, and the battery; and
a housing containing the SoC, the audio transducer, the speaker, the battery, and the wiring.

4. The SoC of claim 1, wherein the decimator is receptive to a pulse density modulation (PDM) signal and generates a pulse code modulation (PCM) signal based on the PDM signal.

5. The SoC of claim 1, wherein the wake-up phrase detector comprises a neural network hardware topology.

6. The SoC of claim 5, wherein the neural network hardware topology is hardwired to receive a decimated signal from the decimator and detect the pre-selected locating phrase in the decimated signal.

7. The SoC of claim 5, wherein the neural network topology comprises a convolution topology and/or recurrent topology.

8. The SoC of claim 1, wherein the waveform generator is configured to receive the interrupt signal from the wake-up phrase detector and provide, in response to receiving the interrupt signal, an electrical signal that when provided to a speaker can produce an audible tone or melody.

9. The SoC of claim 1, wherein the waveform generator is configured to receive the interrupt signal from the wake-up phrase detector and provide, in response to receiving the interrupt signal, an electrical signal having a frequency greater than 20 Hz and less than 20 kHz.

10. The SoC of claim 9, wherein the electrical signal is representative of a melody.

11. The SoC of claim 1, wherein the waveform generator comprises an oscillator.

12. The SoC of claim 1, further comprising:
an analog to digital converter interposed between the input microphone pad and the decimator.

13. The SoC of claim 1, further comprising:
an analog to digital converter interposed between the speaker amplifier and the waveform generator.

* * * * *